United States Patent
Han et al.

(10) Patent No.: US 11,476,826 B2
(45) Date of Patent: Oct. 18, 2022

(54) BULK ACOUSTIC WAVE RESONATOR

(71) Applicant: Samsung Electro-Mechanics Co., Ltd., Suwon-si (KR)

(72) Inventors: Won Han, Suwon-si (KR); Dae Ho Kim, Suwon-si (KR); Yong Suk Kim, Suwon-si (KR); Seung Hun Han, Suwon-si (KR); Moon Chul Lee, Suwon-si (KR); Chang Hyun Lim, Suwon-si (KR); Sung Jun Lee, Suwon-si (KR); Sang Kee Yoon, Suwon-si (KR); Tae Yoon Kim, Suwon-si (KR); Sang Uk Son, Suwon-si (KR)

(73) Assignee: Samsung Electro-Mechanics Co., Ltd., Suwon-si (KR)

( * ) Notice: Subject to any disclaimer, the term of this patent is extended or adjusted under 35 U.S.C. 154(b) by 1374 days.

(21) Appl. No.: 15/812,842

(22) Filed: Nov. 14, 2017

(65) Prior Publication Data
US 2018/0205360 A1  Jul. 19, 2018

(30) Foreign Application Priority Data

Jan. 17, 2017 (KR) ................. 10-2017-0008171
May 22, 2017 (KR) ................. 10-2017-0062807

(51) Int. Cl.
*H03H 9/02* (2006.01)
*H03H 9/17* (2006.01)
(Continued)

(52) U.S. Cl.
CPC .......... *H03H 9/02118* (2013.01); *H03H 3/02* (2013.01); *H03H 9/02015* (2013.01);
(Continued)

(58) Field of Classification Search
CPC .......... H03H 9/02118; H03H 9/02157; H03H 9/132; H03H 9/17
See application file for complete search history.

(56) References Cited

U.S. PATENT DOCUMENTS 5,302,880 A   4/1994 Kaida
6,396,200 B2  5/2002 Misu et al.
(Continued)

FOREIGN PATENT DOCUMENTS

CN  1405905 A  3/2003
CN  1595799 A  3/2005
(Continued)

OTHER PUBLICATIONS

Chinese Office Action dated Jan. 5, 2021 issued in counterpart Chinese Patent Application No. 201810039429.X (13 pages in English)(9 pages in Chinese).
(Continued)

*Primary Examiner* — Bryan P Gordon
(74) *Attorney, Agent, or Firm* — NSIP Law

(57) ABSTRACT

A bulk acoustic wave resonator includes: a substrate; a membrane layer forming a cavity together with the substrate; a lower electrode disposed on the membrane layer; a piezoelectric layer disposed on a flat surface of the lower electrode; and an upper electrode covering a portion of the piezoelectric layer and exposing a side of the piezoelectric layer to air, wherein the piezoelectric layer includes a step portion extended from the side of the piezoelectric layer and disposed on the flat surface of the lower electrode.

20 Claims, 10 Drawing Sheets

(51) Int. Cl.
*H03H 9/13* (2006.01)
*H03H 3/02* (2006.01)
(52) U.S. Cl.
CPC ........ *H03H 9/02157* (2013.01); *H03H 9/132* (2013.01); *H03H 9/17* (2013.01); *H03H 9/173* (2013.01); *H03H 9/174* (2013.01); *H03H 2003/021* (2013.01); *H03H 2003/023* (2013.01)

(56) References Cited

U.S. PATENT DOCUMENTS

| | | | |
|---|---|---|---|
| 8,902,023 | B2 | 12/2014 | Choy et al. |
| 2003/0048041 | A1 | 3/2003 | Kita et al. |
| 2005/0057324 | A1 | 3/2005 | Onishi et al. |
| 2005/0093655 | A1* | 5/2005 | Larson, III ............. H03H 9/132 333/191 |
| 2005/0140247 | A1 | 6/2005 | Lee |
| 2005/0269904 | A1 | 12/2005 | Oka |
| 2008/0284543 | A1* | 11/2008 | Taniguchi ............. H03H 9/173 333/187 |
| 2010/0013575 | A1* | 1/2010 | Inoue ...................... H03H 3/04 333/187 |
| 2011/0006860 | A1* | 1/2011 | Hara ................. H03H 9/02118 333/187 |
| 2012/0200373 | A1* | 8/2012 | Taniguchi .......... H03H 9/02157 333/189 |
| 2016/0163954 | A1* | 6/2016 | Shin ...................... H03H 9/173 29/25.35 |

FOREIGN PATENT DOCUMENTS

| | | |
|---|---|---|
| CN | 101309074 A | 11/2008 |
| CN | 101960717 A | 1/2011 |
| JP | 2002-509644 A | 3/2002 |
| JP | 2003-133890 A | 5/2003 |
| JP | 2005-198233 A | 7/2005 |
| KR | 10-2004-0084478 A | 10/2004 |
| KR | 10-0538654 B1 | 12/2005 |
| KR | 10-2006-0049516 A | 5/2006 |
| KR | 10-2016-0069263 A | 6/2016 |
| WO | WO 98/16956 A1 | 4/1998 |

OTHER PUBLICATIONS

Information Technology of China Masters' Theses Full text Database, Hongmin Jiang, The Study of The Film Bulk Acoustic Resonator Technology (FBAR), pp. 135-1058, Mar. 2016 (1 page in English)(85 pages in Chinese).
Korean Office Action dated Mar. 28, 2018, in corresponding Korean Application No. 10-2017-0062807 (6 pages in English, 5 pages in Korean).

* cited by examiner

BULK ACOUSTIC WAVE RESONATOR

CROSS-REFERENCE TO RELATED APPLICATIONS

This application claims benefit under 35 U.S.C. § 119(a) of Korean Patent Application Nos. 10-2017-0008171 and 10-2017-0062807 filed on Jan. 17, 2017 and May 22, 2017, respectively, in the Korean Intellectual Property Office, the entire disclosure of which is incorporated herein by reference for all purposes.

BACKGROUND

1. Field

The following description relates to a bulk acoustic wave resonator.

2. Description of Related Art

In general, a bulk acoustic wave (BAW) filter is a core element that passes signals within a desired frequency band among radio frequency (RF) signals and blocks signals within an unwanted frequency band among the RF signals in a front end module of a smartphone, a tablet PC, or other mobile device. Demand for BAW filters has increased in accordance with an increase in the market for mobile devices.

A BAW filter may include a plurality of bulk acoustic wave (BAW) resonators, and, if a quality coefficient (Q performance) of the bulk acoustic wave resonator is good, the capability to select only a desired band in the BAW filter are improved, while insertion loss and attenuation performance are also improved.

In addition, in order to improve the quality coefficient of the BAW resonator, resonance energy should be confined in an active area of the BAW resonator by forming a frame around the resonator and reflecting lateral waves generated at the time of a resonance occurring in the resonator.

In general, the frame is formed to be thicker than the active area using the same material as an upper electrode. In a case in which the frame is formed, however, performances of other elements may be degraded due to the active area occupied by the frame. Further, noise may occur in a wide band region due to frame resonance.

SUMMARY

This Summary is provided to introduce a selection of concepts in a simplified form that are further described below in the Detailed Description. This Summary is not intended to identify key features or essential features of the claimed subject matter, nor is it intended to be used as an aid in determining the scope of the claimed subject matter.

In one general aspect, a bulk acoustic wave resonator includes: a substrate; a membrane layer forming a cavity together with the substrate; a lower electrode disposed on the membrane layer; a piezoelectric layer disposed on a flat surface of the lower electrode; and an upper electrode covering a portion of the piezoelectric layer and exposing a side of the piezoelectric layer to air, wherein the piezoelectric layer includes a step portion extended from the side of the piezoelectric layer and disposed on the flat surface of the lower electrode.

The thickness of the step portion may be less than half of an overall thickness of the piezoelectric layer.

A width w by which the step portion protrudes from the side of the piezoelectric layer may satisfy $w=n\times\lambda/4 (n=1, 3, 5, \ldots)$, wherein $\lambda$ is a wavelength of a lateral wave occurring in an active area of the bulk acoustic wave resonator.

A first inclined surface may be formed on the side of the piezoelectric layer, and may be disposed on the step portion.

The first inclined surface may have an angle of inclination of 60° to 90° with respect to the membrane layer.

A second inclined surface may be formed on a side of the step portion.

An edge portion of the lower electrode may protrude from the step portion of the piezoelectric layer or may be disposed inwardly from the step portion.

The bulk acoustic wave resonator may further include a residual sacrificial layer disposed in a space formed by the membrane layer, the piezoelectric layer, and the upper electrode.

The residual sacrificial layer may be formed to embed the step portion of the piezoelectric layer.

The bulk acoustic wave resonator may further include a frequency adjusting layer disposed on the upper electrode.

The bulk acoustic wave resonator of claim may further include a conductive layer partially formed on either one or both of a region of an edge of a top surface of the lower electrode and a region of an edge of a top surface of the upper electrode.

The conductive layer may cover a portion of the piezoelectric layer.

A frequency adjusting layer may be disposed on the top surface of the upper electrode, over the cavity. The conductive layer may cover a portion of an edge of the frequency adjusting layer.

The upper electrode may include a support member disposed on the membrane layer so as to be spaced apart from the lower electrode, an extending part extended from the support member and spaced apart from the piezoelectric layer, and a connecting part extended from the extending part and covering a top surface of the piezoelectric layer.

In another general aspect, a bulk acoustic wave resonator includes: a substrate; a membrane layer including a convex part forming a cavity together with the substrate; a lower electrode disposed on the membrane layer; a piezoelectric layer disposed on a flat surface of the lower electrode; an upper electrode including a support member disposed on the membrane layer so as to be spaced apart from the lower electrode, an extending part extended from the support member and spaced apart from the piezoelectric layer, and a connecting part extended from the extending part and disposed on a top surface of the piezoelectric layer, wherein the piezoelectric layer includes a step portion extended from a side of the piezoelectric layer and disposed on the flat surface of the lower electrode.

The extending part may be inclined, and an edge of the convex part of the membrane layer may be inclined to have a gradient corresponding to a gradient of the extending part.

A thickness of the step portion may be less than half of an overall thickness of the piezoelectric layer. A width w by which the step portion protrudes from the side of the piezoelectric layer may satisfy $w=n\times\lambda/4(n=1, 3, 5, \ldots )$, wherein $\lambda$ is a wavelength of a lateral wave occurring in an active area of the bulk acoustic wave resonator.

The support member, the extending part, and the connecting part may form a step shape.

BRIEF DESCRIPTION OF DRAWINGS

Throughout the drawings and the detailed description, the same reference numerals refer to the same elements. The drawings may not be to scale, and the relative size, proportions, and depiction of elements in the drawings may be exaggerated for clarity, illustration, and convenience.

DETAILED DESCRIPTION

Figure 1:
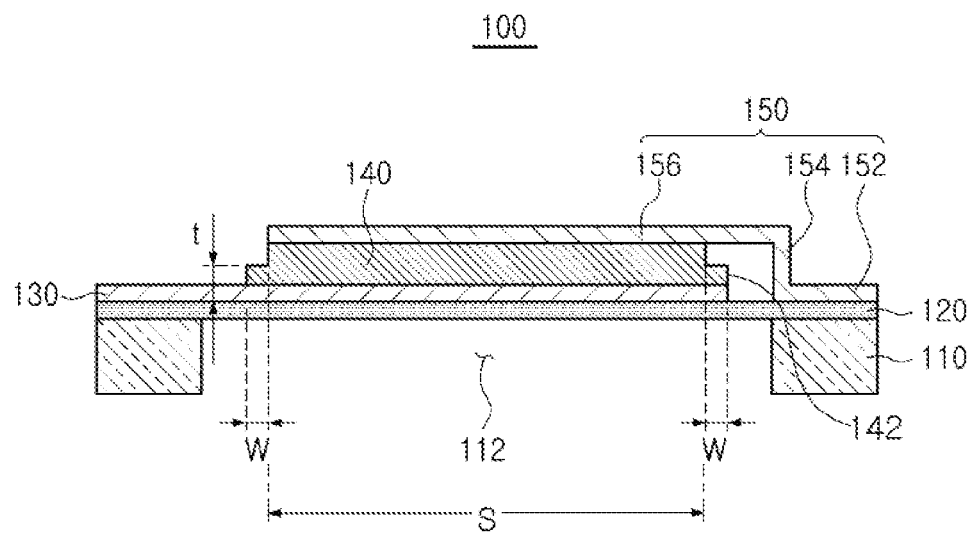
FIG. 1 is a schematic configuration view illustrating a bulk acoustic wave resonator, according to an embodiment.

The following detailed description is provided to assist the reader in gaining a comprehensive understanding of the methods, apparatuses, and/or systems described herein. However, various changes, modifications, and equivalents of the methods, apparatuses, and/or systems described herein will be apparent after an understanding of the disclosure of this application. For example, the sequences of operations described herein are merely examples, and are not limited to those set forth herein, but may be changed as will be apparent after an understanding of the disclosure of this application, with the exception of operations necessarily occurring in a certain order. Also, descriptions of features that are known in the art may be omitted for increased clarity and conciseness.

The features described herein may be embodied in different forms, and are not to be construed as being limited to the examples described herein. Rather, the examples described herein have been provided merely to illustrate some of the many possible ways of implementing the methods, apparatuses, and/or systems described herein that will be apparent after an understanding of the disclosure of this application.

Throughout the specification, when an element, such as a layer, region, or substrate, is described as being "on," "connected to," "coupled to," "over," or "covering" another element, it may be directly "on," "connected to," "coupled to," "over," or "covering" the other element, or there may be one or more other elements intervening therebetween. In contrast, when an element is described as being "directly on," "directly connected to," "directly coupled to," "directly over," or "directly covering" another element, there can be no other elements intervening therebetween.

As used herein, the term "and/or" includes any one and any combination of any two or more of the associated listed items.

Although terms such as "first," "second," and "third" may be used herein to describe various members, components, regions, layers, or sections, these members, components, regions, layers, or sections are not to be limited by these terms. Rather, these terms are only used to distinguish one member, component, region, layer, or section from another member, component, region, layer, or section. Thus, a first member, component, region, layer, or section referred to in examples described herein may also be referred to as a second member, component, region, layer, or section without departing from the teachings of the examples.

Spatially relative terms such as "above," "upper," "below," and "lower" may be used herein for ease of description to describe one element's relationship to another element as shown in the figures. Such spatially relative terms are intended to encompass different orientations of the device in use or operation in addition to the orientation depicted in the figures. For example, if the device in the figures is turned over, an element described as being "above" or "upper" relative to another element will then be "below" or "lower" relative to the other element. Thus, the term "above" encompasses both the above and below orientations depending on the spatial orientation of the device. The device may also be oriented in other ways (for example, rotated 90 degrees or at other orientations), and the spatially relative terms used herein are to be interpreted accordingly.

The terminology used herein is for describing various examples only, and is not to be used to limit the disclosure. The articles "a," "an," and "the" are intended to include the plural forms as well, unless the context clearly indicates otherwise. The terms "comprises," "includes," and "has" specify the presence of stated features, numbers, operations, members, elements, and/or combinations thereof, but do not preclude the presence or addition of one or more other features, numbers, operations, members, elements, and/or combinations thereof.

Due to manufacturing techniques and/or tolerances, variations of the shapes shown in the drawings may occur. Thus, the examples described herein are not limited to the specific shapes shown in the drawings, but include changes in shape that occur during manufacturing.

The features of the examples described herein may be combined in various ways as will be apparent after an understanding of the disclosure of this application. Further, although the examples described herein have a variety of configurations, other configurations are possible as will be apparent after an understanding of the disclosure of this application.

Hereinafter, embodiments will be described in detail with reference to the accompanying drawings.

Figure 2:
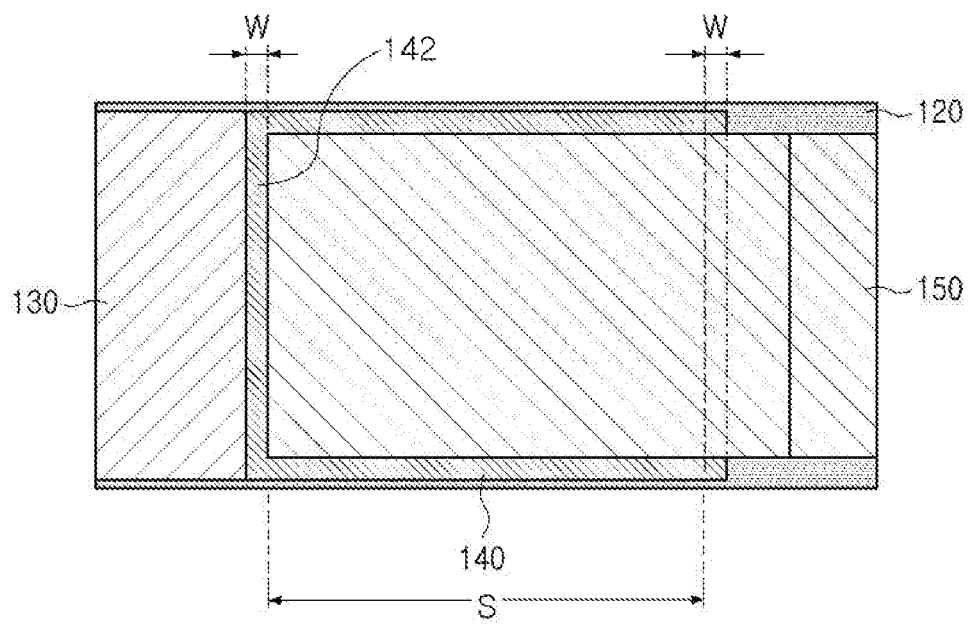
FIG. 2 is a plan view illustrating the bulk acoustic wave resonator of FIG. 1, according to an embodiment.

FIG. 1 is a schematic configuration view illustrating a configuration of a bulk acoustic wave resonator 100, according to an embodiment. FIG. 2 is a plan view illustrating the configuration of the bulk acoustic wave resonator 100.

Referring to FIGS. 1 and 2, a bulk acoustic wave resonator 100 includes, for example, a substrate 110, a membrane layer 120, a lower electrode 130, a piezoelectric layer 140, and an upper electrode 150.

The substrate 110 may be a substrate on which silicon is stacked. For example, a silicon wafer is used as the substrate. A protective layer (not shown) may be provided on the substrate 110.

In addition, the substrate 110 forms a cavity 112 together with a membrane layer 120.

The membrane layer 120 is formed on a top surface of the substrate 110 and forms the cavity 112 together with the substrate 110. The membrane layer 120 prevents the lower electrode 130 from being damaged by etching gas when a sacrificial layer (not shown) is removed during the manufacturing of the bulk acoustic wave resonator 100. As an example, the membrane layer 120 is formed of a material having low reactivity with halide-based etching gas. For example, the membrane layer 120 is formed of a material such as silicon nitride (SiN) or silicon oxide (SiO$_2$).

The lower electrode 130 is disposed on the membrane layer 120. The lower electrode 130 is formed on the membrane layer 120 so that a portion thereof is disposed over a cavity 112. As an example, the lower electrode 130 is formed of a conductive material such as molybdenum (Mo), ruthenium (Ru), tungsten (W), iridium (Ir), or platinum (Pt), or alloys thereof.

In addition, the lower electrode 130 may be used as either one of an input electrode that inputs an electrical signal such as a radio frequency (RF) signal, and an output electrode.

The piezoelectric layer 140 is formed on a flat surface of the lower electrode 130 and is disposed over the cavity 112. In addition, the piezoelectric layer 140 includes a step portion 142 extended from a side thereof, at a lower portion of the side, and disposed on the flat surface of the lower electrode 130. In other words, the bulk acoustic wave resonator 100 includes the piezoelectric layer 140 including the side in a shape of a multistage edge, without having a separate frame formed on the upper electrode 150.

Accordingly, a lateral wave propagating from an upper end portion of the piezoelectric layer 140 may encounter the air at a side of the upper end portion of the piezoelectric layer 140, thereby increasing a reflection coefficient. In addition, the lateral wave propagating from a lower end portion of the piezoelectric layer 140 may additionally reflect a leakage wave by the step portion 142 protruding from the lower end portion of the piezoelectric layer 140, thereby decreasing lateral wave leakage. In other words, the leakage wave may be additionally reflected by a width w of the step portion 142 (e.g., the width by which the step portion 142 protrudes from a remaining portion of the side of the piezoelectric layer 140, which is an upper end portion of the piezoelectric layer 140), thereby decreasing lateral wave leakage.

During resonance driving of the bulk acoustic wave resonator 100, a lateral wave having a plurality of modes may occur, and the lateral wave may propagate in a lateral direction in a form of various modes (S1, A1, S0, A0 modes, etc.) at an antiresonance frequency, causing loss of energy. Accordingly, the bulk acoustic wave resonator 100 may sequentially reflect these modes by using the multistage edge. That is, in a case in which the lateral wave occurring from an active area S of the bulk acoustic wave resonator 100 arrives at the side of the upper end portion of the piezoelectric layer 140, the modes (S1, A1, etc.) having a relatively long wavelength may reflect the lateral wave, and the modes (S0, A0, etc.) having a relatively short wavelength may reflect the lateral wave by using two boundary surfaces formed by the protruded step portion 142 of the piezoelectric layer 140, thereby improving reflection efficiency.

In this case, when the width w of the step portion 142 of the piezoelectric layer 140 is designed by considering a wavelength $\lambda$ as in the following Equation 1, the reflection efficiency may be significantly increased, thereby making it possible to increase quality factor (Q performance).

$$w = n \times \lambda/4 (n=1, 3, 5, \ldots).$$

In Equation 1, $\lambda$ is a wavelength of the lateral wave occurring in the active area.

Further, when a thickness t of the step portion 142 is less than half of an overall thickness of the piezoelectric layer 140, an effect on reflection of lateral waves may be larger, and when the thickness t of the step portion 142 is varied, a value of an optimal width w may be changed.

The upper electrode 150 covers at least a portion of the piezoelectric layer 140, and is formed to expose side of the piezoelectric layer 140 to the air. The upper electrode 150 has a step shape. As an example, the upper electrode 150 includes a support member 152 formed on the membrane layer 120 to be spaced apart from the lower electrode 130, an extending part 154 extended from the support member 152 and spaced apart from the piezoelectric layer 140, and a connecting part 156 extended from the extending part 154 and covering a top surface of the piezoelectric layer 140.

In addition, the upper electrode 150 is formed of a conductive material such as molybdenum (Mo), ruthenium (Ru), tungsten (W), iridium (Ir), or platinum (Pt), or alloys thereof, similarly to the lower electrode 130.

The upper electrode 150 may be used as either one of an input electrode that inputs an electrical signal such as a radio frequency (RF) signal, and an output electrode. That is, in a case in which the lower electrode 130 is used as the input electrode, the upper electrode 150 is used as the output electrode, and in a case in which the lower electrode 130 is used as the output electrode, the upper electrode 150 is used as the input electrode.

As illustrated in FIG. 2, the bulk acoustic wave resonator 100 may have a quadrangular shape when viewed from the top, and the piezoelectric layer 140 may also have the quadrangular shape when viewed from the top.

The active area S described herein refers to an area in which all of the lower electrode 130, the piezoelectric layer 140, and the upper electrode 150 overlap with each other.

As described above, the reflection leakage of the lateral wave may be reduced.

Figure 3:
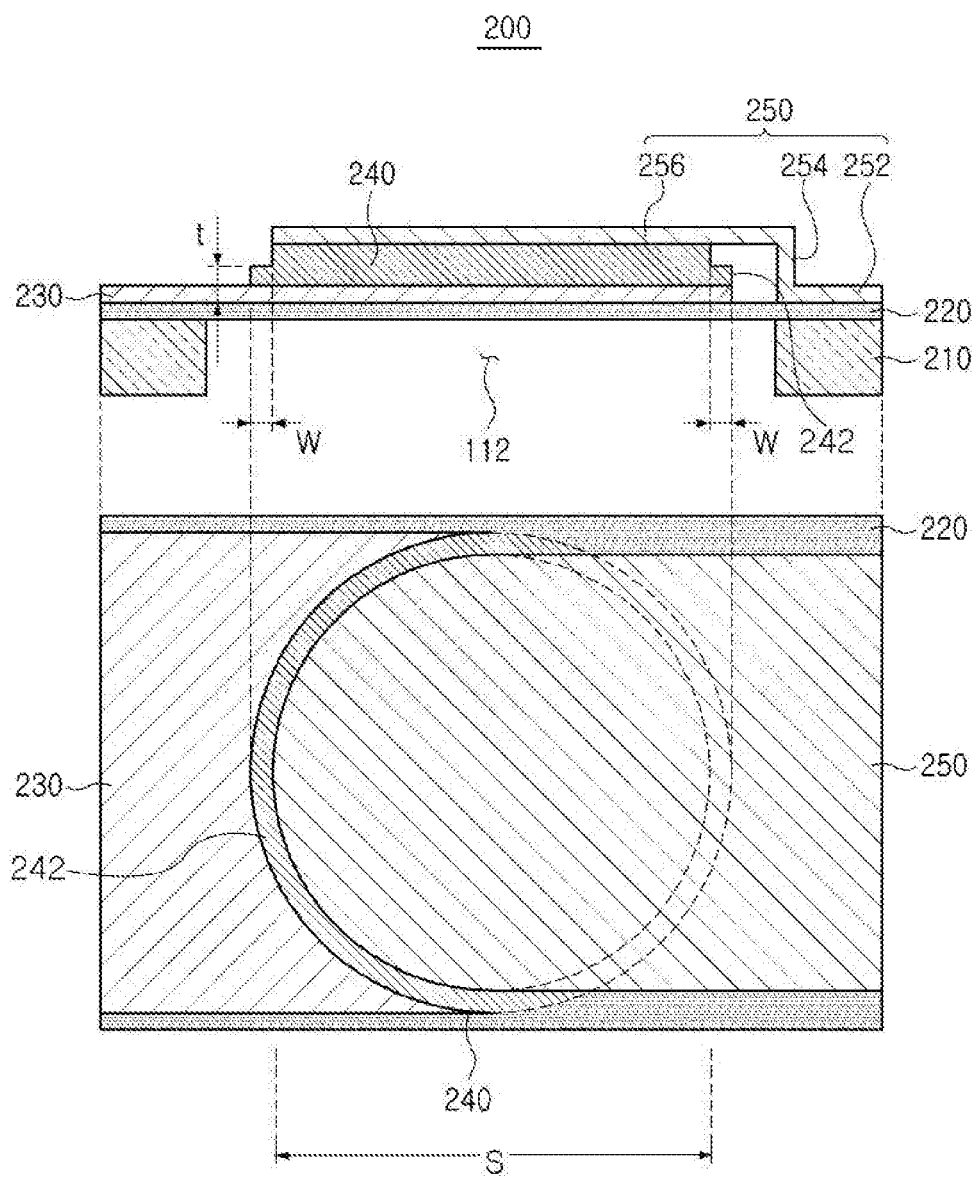
FIG. 3 is a configuration view and a plan view illustrating a bulk acoustic wave resonator, according to another embodiment.

FIG. 3 is a configuration view and a plan view illustrating a configuration of a bulk acoustic wave resonator 200, according to another embodiment.

Referring to FIG. 3, the bulk acoustic wave resonator 200 includes, for example, a substrate 210, a membrane layer 220, a lower electrode 230, a piezoelectric layer 240 including a step portion 242, and an upper electrode 250 including a support member 252, an extending part 254, and a connecting part 256.

Since the substrate 210, the membrane layer 220, the lower electrode 230, the piezoelectric layer 240 (including the step portion 242), and the upper electrode 250 (including the support member 252, the extending part 254, and the connecting part 256) differ only in a shape with respect to the substrate 110, the membrane layer 120, the lower electrode 130, the piezoelectric layer 140, and the upper electrode 150 described above and are substantially the same as the above-mentioned components, a detailed description thereof will be omitted and will be replaced with the description provided above.

As illustrated in FIG. 3, the piezoelectric layer 240 has a circular shape when viewed from the top.

Figure 4:
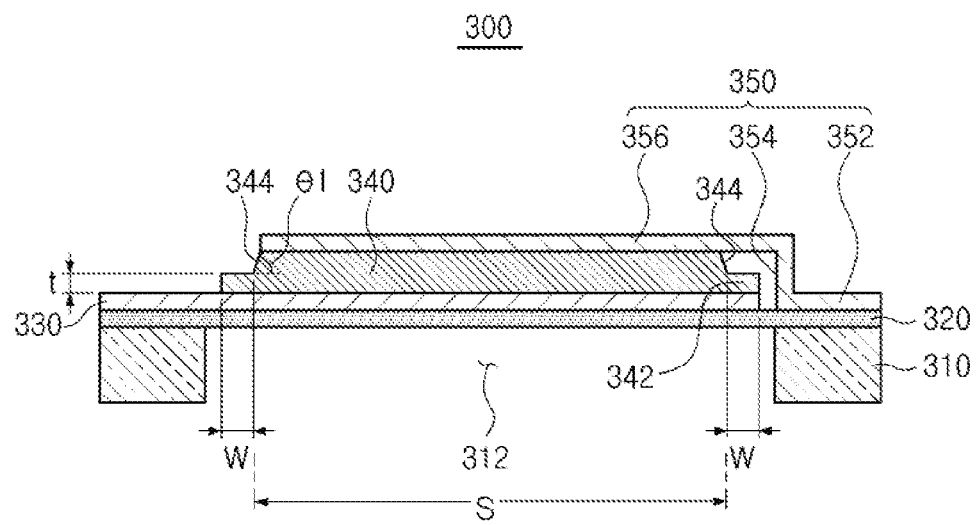
FIG. 4 is a schematic configuration view illustrating a bulk acoustic wave resonator, according to another embodiment.

FIG. 4 is a schematic configuration view illustrating a configuration of a bulk acoustic wave resonator 300, according to another embodiment.

Referring to FIG. 4, the bulk acoustic wave resonator 300 includes, for example, a substrate 310, a membrane layer 320, a lower electrode 330, a piezoelectric layer 340, and an upper electrode 350.

Since the substrate 310, the membrane 320, the lower electrode 330, and the upper electrode 350 are substantially the same as the substrate 110, the membrane layer 120, the lower electrode 130, and the upper electrode 150, which are included in the bulk acoustic wave resonator 100 described above, a detailed description of the substrate 310, the membrane 320, the lower electrode 330, and the upper electrode 350 will be omitted herein and will be replaced with the description provided above.

The piezoelectric layer 340 is formed on a flat surface of the lower electrode 330 to be disposed over a cavity 312. In addition, the piezoelectric layer 340 includes a step portion 342 extended from a side thereof, at a lower portion of the side, and disposed on the flat surface of the lower electrode 330. In other words, the bulk acoustic wave resonator 300 includes the piezoelectric layer 340 including the side in a shape of a multistage edge, without forming a separate frame on the upper electrode 350.

Further, a first inclined surface 344 of the piezoelectric layer 340 is formed on the side of the piezoelectric layer 340, at an upper end portion of the piezoelectric layer 340, and may be formed in a final etching operation for forming the piezoelectric layer 340. In addition, an angle of inclination θ1 of the first inclined surface 344 may be approximately 60° to 90°. Accordingly, a reflection coefficient of the lateral wave may be relatively increased.

As an example, as the angle of inclination θ1 of the first inclined surface 344 approaches 90°, the quality factor (Q performance) is improved.

In addition, a width of the step portion 342 may be determined based on a wavelength of the lateral wave. Therefore, when the step portion 342 is formed to have an appropriate width w (e.g., the width obtained by Equation 1 provided above), the leakage wave may be reduced and the reflection efficiency may be increased, thereby improving the quality factor (Q performance).

Further, when a thickness t of the step portion 342 is less than half of an overall thickness of the piezoelectric layer 340, an effect on reflection of lateral waves may be larger, and when the thickness t of the step portion 342 is varied, a value of an optimal width w may be changed.

Figure 5:
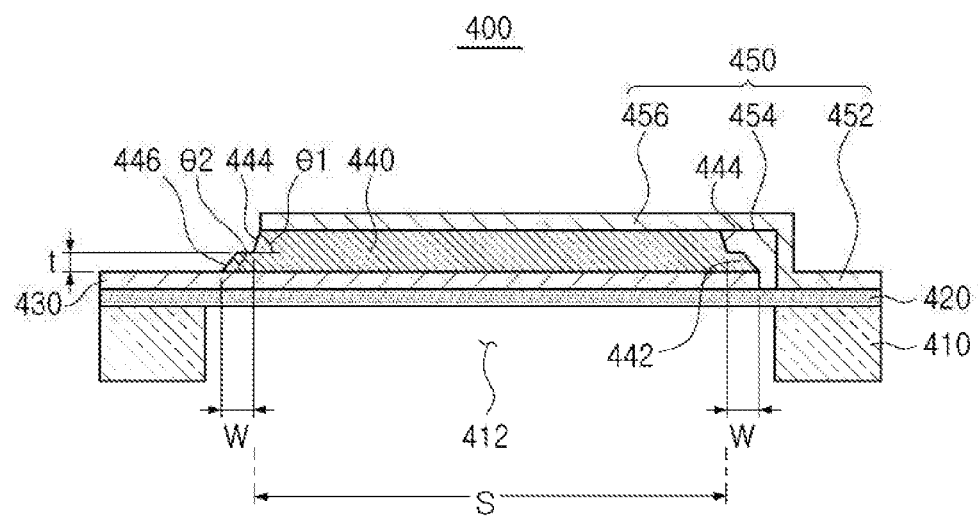
FIG. 5 is a schematic configuration view illustrating a bulk acoustic wave resonator, according to another embodiment.

FIG. 5 is a schematic configuration view illustrating a configuration of a bulk acoustic wave resonator 400, according to another embodiment.

Referring to FIG. 5, the bulk acoustic wave resonator 400 includes, for example, a substrate 410, a membrane layer 420, a lower electrode 430, a piezoelectric layer 440, and an upper electrode 450.

Since the substrate 410, the membrane 420, the lower electrode 430, and the upper electrode 450 are substantially the same as the substrate 110, the membrane layer 120, the lower electrode 130, and the upper electrode 150, which are included in the bulk acoustic wave resonator 100 described above, a detailed description of the substrate 410, the membrane 420, the lower electrode 430, and the upper electrode 450 will be omitted herein and will be replaced with the description provided above.

The piezoelectric layer 440 is formed on a flat surface of the lower electrode 430 and is disposed over a cavity 412. In addition, the piezoelectric layer 440 includes a step portion 442 extended from a side thereof, at a lower portion of the side, and disposed on the flat surface of the lower electrode 430. In other words, the bulk acoustic wave resonator 400 includes the piezoelectric layer 440 including the side in a shape of a multistage edge, without forming a separate frame on the upper electrode 450.

Further, a first inclined surface 444 of the piezoelectric layer 440 is formed on the side of the piezoelectric layer 444, at an upper end portion of the piezoelectric layer 440, and may be formed in a final etching operation for forming the piezoelectric layer 440. In addition, an angle of inclination θ1 of the first inclined surface 444 may be approximately 60° to 90°. Accordingly, a reflection coefficient of the lateral wave may be relatively increased.

As an example, as the angle of inclination θ1 of the first inclined surface 444 approaches 90°, the quality factor (Q performance) may be improved.

In addition, a width of the step portion 442 may be determined based on a wavelength of the lateral wave. Therefore, when the step portion 442 is formed to have an appropriate width w (e.g., the width obtained by Equation 1 provided above), the leakage wave may be reduced and the reflection efficiency may be increased, thereby improving the quality factor (Q performance).

Further, when a thickness of the step portion 442 is less than half of an overall thickness of the piezoelectric layer 440, an effect on reflection of lateral waves may be greater, and when the thickness of the step portion 442 is varied, a value of an optimal width w may be changed.

In addition, a second inclined surface 446 is also formed on a side of the step portion 442, and when an angle of inclination θ2 of the second inclined surface 446 is varied, the width w of the step portion 442 may be varied.

Figure 6:
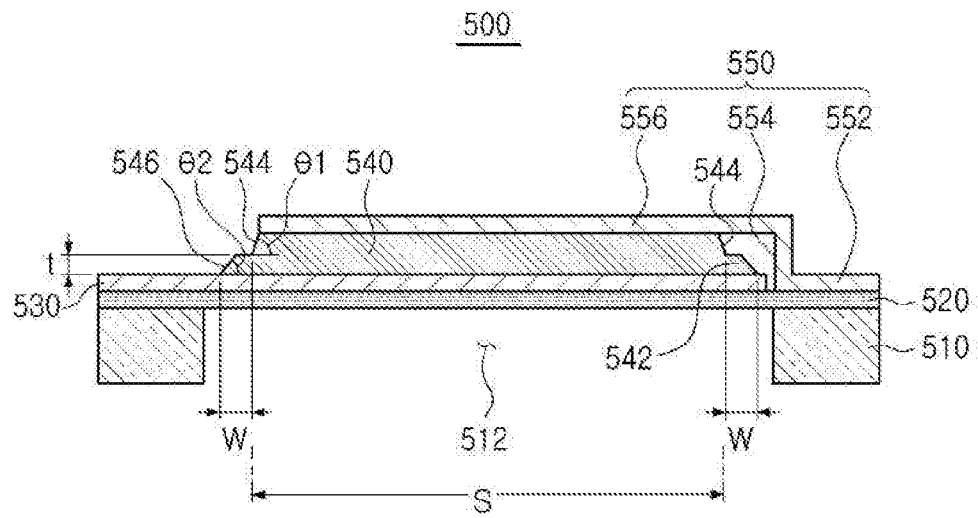
FIG. 6 is a schematic configuration view illustrating a bulk acoustic wave resonator, according to another embodiment.

FIG. 6 is a schematic configuration view illustrating a configuration of a bulk acoustic wave resonator 500, according to another embodiment Referring to FIG. 6, the bulk acoustic wave resonator 500 includes, for example, a substrate 510, a membrane layer 520, a lower electrode 530, a piezoelectric layer 540, and an upper electrode 550.

Since the substrate 510, the membrane 520, the lower electrode 530, and the upper electrode 550 are substantially the same as the substrate 110, the membrane layer 120, the lower electrode 130, and the upper electrode 150, which are included in the bulk acoustic wave resonator 100 described above, a detailed description of the substrate 510, the membrane 520, the lower electrode 530, and the upper electrode 550 will be omitted hereinafter and will be replaced with the description provided above.

The piezoelectric layer 540 is formed on a flat surface of the lower electrode 530 and is disposed over a cavity 512.

In addition, the piezoelectric layer 540 includes a step portion 542 extended from a side thereof and disposed on the flat surface of the lower electrode 530. In other words, the bulk acoustic wave resonator 500 includes the piezoelectric layer 540 including the side in a shape of a multistage edge, without forming a separate frame on the upper electrode 550.

Further, a first inclined surface 544 is formed on the side of the piezoelectric layer 540, at an upper end portion of the piezoelectric layer 540, and may be formed in a final etching operation for forming the piezoelectric layer 540. In addition, an angle of inclination θ1 of the first inclined surface 544 may be approximately 60° to 90°. Accordingly, a reflection coefficient of the lateral wave may be relatively increased.

As an example, as the angle of inclination θ1 of the first inclined surface 544 closes to 90°, the quality factor (Q performance) may be improved.

In addition, a width of the step portion 542 may be based on a wavelength of the lateral wave. Therefore, when the step portion 542 is formed to have an appropriate width w (e.g., the width obtained by Equation 1 provided above), the leakage wave may be reduced and the reflection efficiency may be increased, thereby improving the quality factor (Q performance).

Further, when a thickness of the step portion 542 is less than half of an overall thickness of the piezoelectric layer 540, an effect on reflection of lateral waves may be larger, and when the thickness of the step portion 542 is varied, a value of an optimal width w may be changed.

In addition, a second inclined surface 546 is also formed on a side of the step portion 542, and when an angle of inclination θ2 of the second inclined surface 546 is varied, the width w of the step portion 542 may be varied.

The step portion 542 does not protrude outwardly beyond the lower electrode 130 and is inwardly spaced apart from an edge of the lower electrode 130 by a predetermined distance. As such, since the step portion 542 does not form the same boundary as an end of the lower electrode 130, reflection performance of the lateral wave may be improved in association with the wavelength of the lateral wave.

Figure 7:
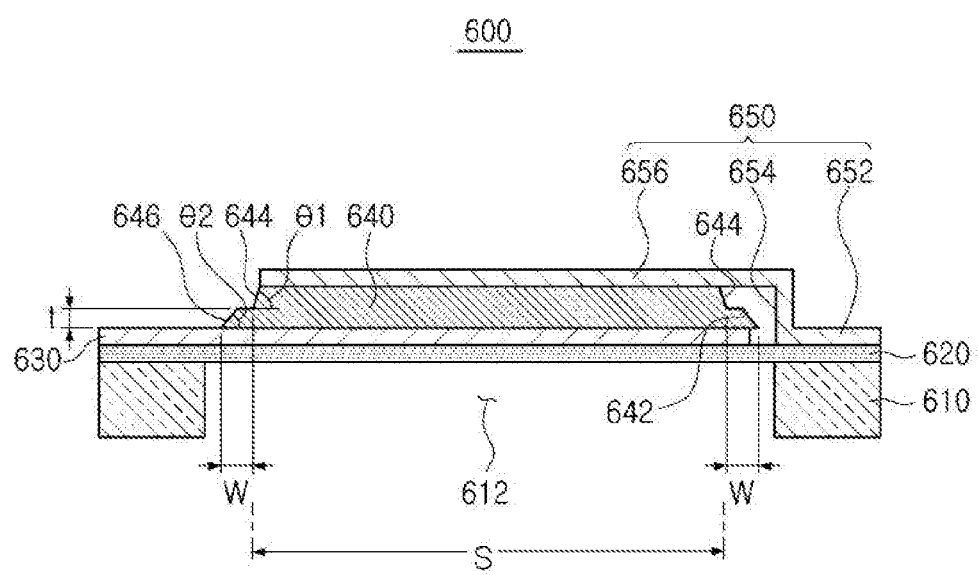
FIG. 7 is a schematic configuration view illustrating a bulk acoustic wave resonator, according to another embodiment.

FIG. 7 is a schematic configuration view illustrating a configuration of a bulk acoustic wave resonator 600, according to another embodiment.

Referring to FIG. 7, the bulk acoustic wave resonator 600 includes, for example, a substrate 610, a membrane layer 620, a lower electrode 630, a piezoelectric layer 640, and an upper electrode 650.

Since the substrate 610, the membrane 620, the lower electrode 630, and the upper electrode 650 are substantially the same as the substrate 110, the membrane layer 120, the lower electrode 130, and the upper electrode 150, which are included in the bulk acoustic wave resonator 100 described above, a detailed description of the substrate 610, the membrane 620, the lower electrode 630, and the upper electrode 650 will be omitted herein and will be replaced with the description provided above.

The piezoelectric layer 640 is formed on a flat surface of the lower electrode 630 and is disposed over a cavity 612. In addition, the piezoelectric layer 640 includes a step portion 642 extended from a side thereof and disposed on the flat surface of the lower electrode 630. In other words, the bulk acoustic wave resonator 600 includes the piezoelectric layer 640 including the side in a shape of a multistage edge, without forming a separate frame on the upper electrode 650.

Further, a first inclined surface 644 is formed on the side of the piezoelectric layer 640, at an upper end portion of the piezoelectric layer 640, and may be formed in a final etching operation for forming the piezoelectric layer 640. In addition, an angle of inclination θ1 of the first inclined surface 644 may be approximately 60° to 90°. Accordingly, a reflection coefficient of the lateral wave may be relatively increased.

As an example, as the angle of inclination θ1 of the first inclined surface 644 closes to 90°, the quality factor (Q performance) may be improved.

In addition, a width of the step portion 642 may be based on a wavelength of the lateral wave. Therefore, when the step portion 642 is formed to have an appropriate width w (e.g., the width obtained by Equation 1 provided above), the leakage wave may be reduced and the reflection efficiency may be increased, thereby improving the quality factor (Q performance).

Further, when a thickness of the step portion 642 is less than half of an overall thickness of the piezoelectric layer 640, an effect on reflection of lateral waves may be larger, and when the thickness of the step portion 642 is varied, a value of an optimal width w may be changed.

In addition, a second inclined surface 646 is also formed on a side of the step portion 642, and when an angle of inclination θ2 of the second inclined surface 646 is varied, the width w of the step portion 642 may be varied.

A portion of the step portion 642 protrudes outwardly beyond the lower electrode 630. As such, since the step portion 642 does not form the same boundary as an end of the lower electrode 630, reflection performance of the lateral wave may be improved in association with the wavelength of the lateral wave.

Figure 8:
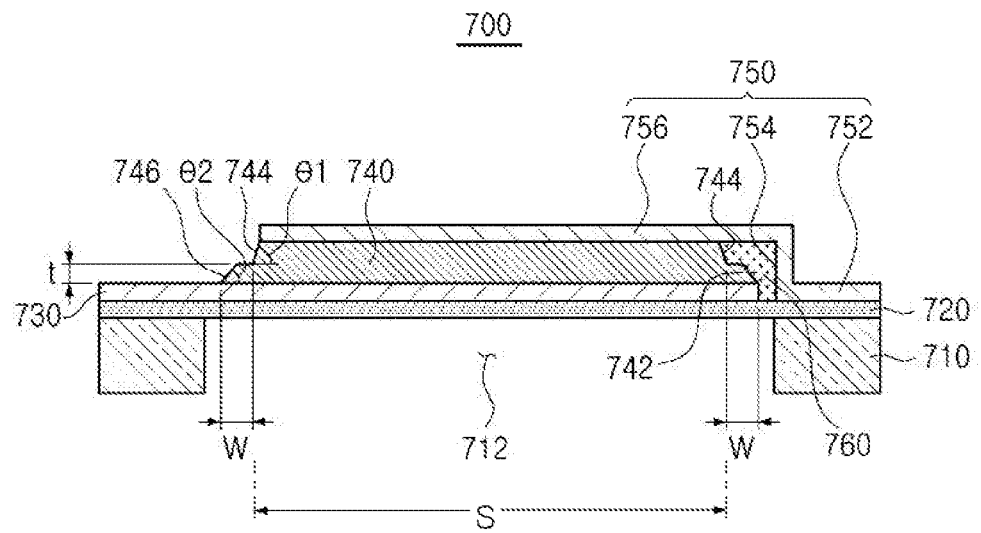
FIG. 8 is a schematic configuration view illustrating a bulk acoustic wave resonator, according to another embodiment.

FIG. 8 is a schematic configuration view illustrating a configuration of a bulk acoustic wave resonator 700, according to another embodiment.

Referring to FIG. 8, the bulk acoustic wave resonator 700 includes, for example, a substrate 710, a membrane layer 720, a lower electrode 730, a piezoelectric layer 740, an upper electrode 750, and a residual sacrificial layer 760.

Since the substrate 710, the membrane 720, the lower electrode 730, and the upper electrode 750 are substantially the same as the substrate 110, the membrane layer 120, the lower electrode 130, and the upper electrode 150, which are included in the bulk acoustic wave resonator 100 \ described above, a detailed description of the substrate 710, the membrane 720, the lower electrode 730, and the upper electrode 750 will be omitted herein and will be replaced with the description provided above.

In addition, since the piezoelectric layer 740, which includes a step portion 742, a first inclined surface 744, and a second inclined surface 746, is the same component as the piezoelectric layer 440 included in the bulk acoustic wave resonator 400 described above, a detailed description of the piezoelectric layer 740 will be omitted and will be replaced with the description above.

The residual sacrificial layer 760 is formed in a space formed by the membrane layer 720, the piezoelectric layer 740, and the upper layer 750. That is, the residual sacrificial layer 760 surrounds one region of the piezoelectric layer 740, so that a medium having an acoustic impedance value that is largely different from an acoustic impedance value of the resonating part is disposed outside the piezoelectric layer 740.

At a boundary between the medium and the piezoelectric layer 740, the reflection coefficient of the lateral wave may be affected by a shape of a boundary surface formed by the piezoelectric layer 740, as well as the medium.

However, the shape of the boundary surface as well as medium are changeable by the residual sacrificial layer 760, lateral wave reflection performance may be improved.

Figure 9:
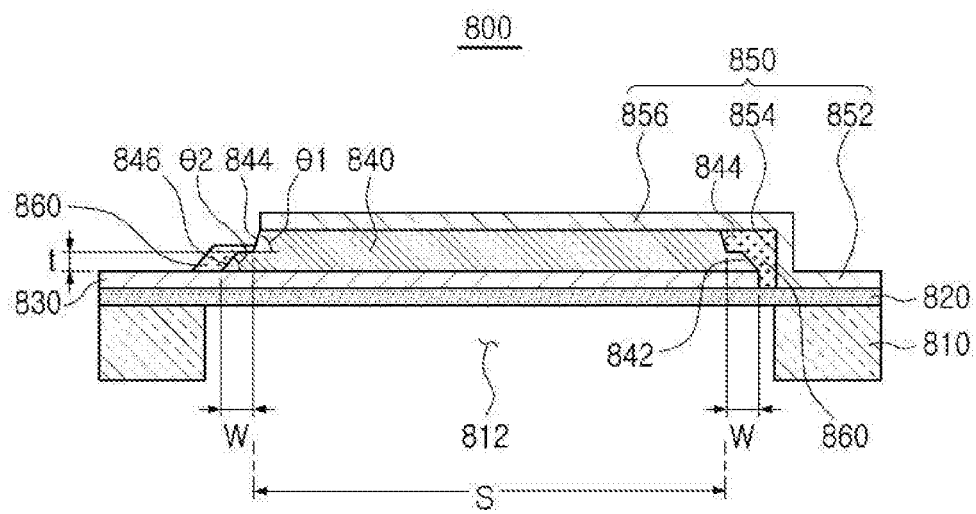
FIG. 9 is a schematic configuration view illustrating a bulk acoustic wave resonator, according to another embodiment.

FIG. 9 is a schematic configuration view illustrating a configuration of a bulk acoustic wave resonator 800, according to another embodiment.

Referring to FIG. 9, the bulk acoustic wave resonator 800 includes, for example, a substrate 810, a membrane layer 820, a lower electrode 830, a piezoelectric layer 840, an upper electrode 850, and a residual sacrificial layer 860.

Since the substrate 810, the membrane 820, the lower electrode 830, and the upper electrode 850 are substantially the same as the substrate 110, the membrane layer 120, the lower electrode 130, and the upper electrode 150 which are included in the bulk acoustic wave resonator 100 described above, a detailed description of the substrate 810, the membrane 820, the lower electrode 830, and the upper electrode 850 will be omitted herein and will be replaced with the description provided above.

In addition, since the piezoelectric layer 840, which includes a step portion 842, a first inclined surface 844, and a second inclined surface 846, is the same component as the piezoelectric layer 440 included in the bulk acoustic wave resonator 400 described above, a detailed description of the piezoelectric layer 840 will be omitted and will be replaced with the description above.

The residual sacrificial layer 860 is disposed to surround the piezoelectric layer 840. As an example, a portion of the residual sacrificial layer 860 is formed in a space formed by the membrane layer 820, the piezoelectric layer 840, and the upper electrode 850, and the remaining portion of the residual sacrificial layer 860 is exposed externally.

Figure 10:
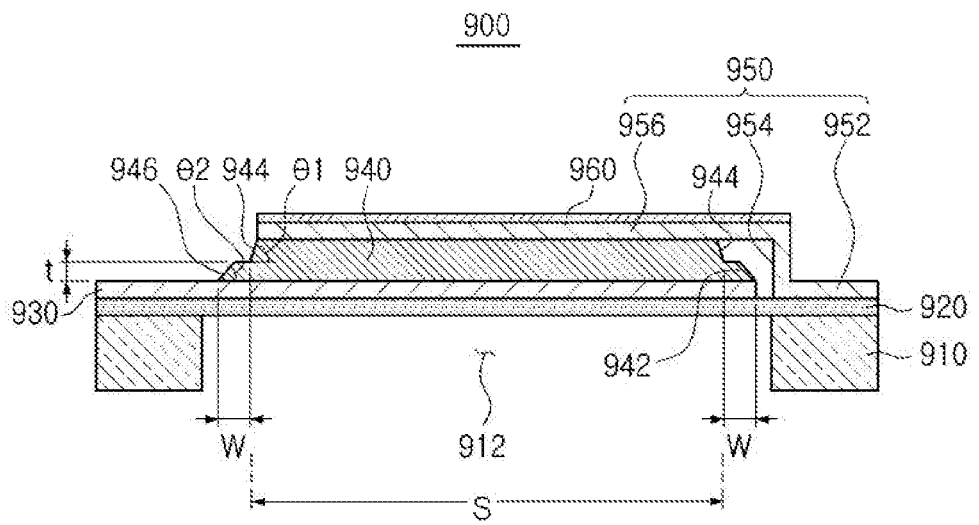
FIG. 10 is a schematic configuration view illustrating a bulk acoustic wave resonator, according to another embodiment.

FIG. 10 is a schematic configuration view illustrating a bulk acoustic wave resonator 900, according to another embodiment.

Referring to FIG. 10, the bulk acoustic wave resonator 900 includes, for example, a substrate 910, a membrane layer 920, a lower electrode 930, a piezoelectric layer 940, an upper electrode 950, and a frequency adjusting layer 960.

Since the substrate 910, the membrane 920, the lower electrode 930, and the upper electrode 950 are substantially the same as the substrate 110, the membrane layer 120, the lower electrode 130, and the upper electrode 150, which are included in the bulk acoustic wave resonator 100, a detailed description of the substrate 910, the membrane 920, the lower electrode 930, and the upper electrode 950 will be omitted herein and will be replaced with the description provided above.

In addition, since the piezoelectric layer 940, which includes a step portion 942, a first inclined surface 944, and a second inclined surface 946, is the same component as the piezoelectric layer 440 included in the bulk acoustic wave resonator 400, a detailed description of the piezoelectric layer 940 will be omitted and will be replaced with the description above.

The frequency adjusting layer 960 is formed on the upper electrode 950. As an example, the frequency adjusting layer 960 is formed on a portion of the upper electrode 950 that is disposed on the piezoelectric layer 940.

In addition, the frequency adjusting layer 960 adjusts a frequency variation due to a process deviation of a film thickness of a plurality of layers. The frequency adjusting layer 960 may be effective when using a dielectric, and may be formed of a material that can be used as a protective layer when the resonator is released. As an example, the frequency adjusting layer 960 may is formed of silicon oxide ($SiO_2$), silicon nitride (SiN), aluminum oxide ($Al_2O_3$), or aluminum nitride (AlN).

Figure 11:
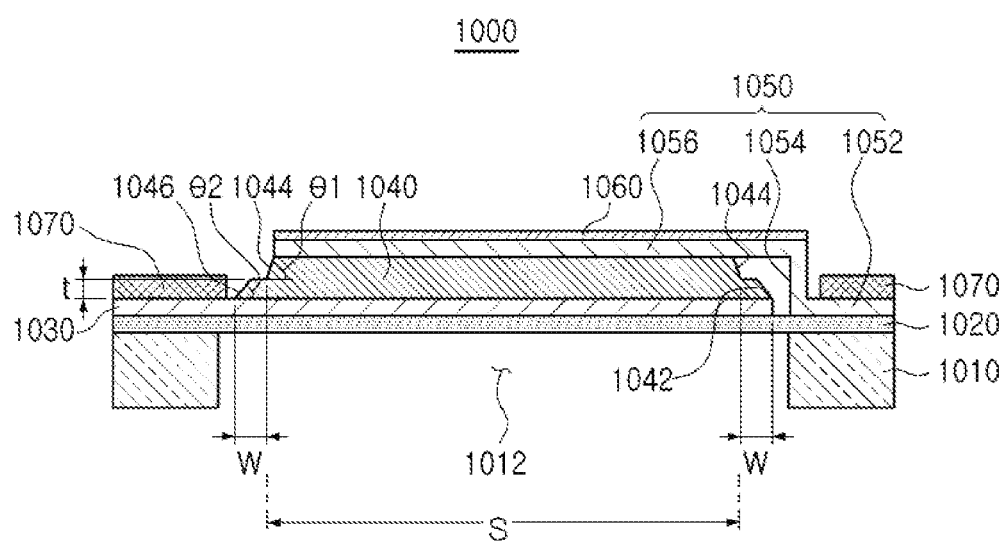
FIG. 11 is a schematic configuration view illustrating a bulk acoustic wave resonator, according to another embodiment.

FIG. 11 is a schematic configuration view illustrating a bulk acoustic wave resonator 1000, according to another embodiment.

Referring to FIG. 11, the bulk acoustic wave resonator 1000 includes, for example, a substrate 1010, a membrane layer 1020, a lower electrode 1030, a piezoelectric layer 1040, an upper electrode 1050, a frequency adjusting layer 1060, and a conductive layer 1070.

Since the substrate 1010, the membrane 1020, the lower electrode 1030, and the upper electrode 1050 are substantially the same as the substrate 110, the membrane layer 120, the lower electrode 130, and the upper electrode 150, which are included in the bulk acoustic wave resonator 100, a detailed description of the substrate 1010, the membrane 1020, the lower electrode 1030, and the upper electrode 1050 will be omitted herein and will be replaced with the description provided above.

In addition, since the piezoelectric layer 1040, which includes a step portion 1042, a first inclined surface 1044, and a second inclined surface 1046, is the same component as the piezoelectric layer 440 included in the bulk acoustic wave resonator 400 described above, a detailed description of the piezoelectric layer 1040 will be omitted and will be replaced with the description above.

In addition, since the frequency adjusting layer 1060 is the same component as the frequency adjusting layer 960 included in the bulk acoustic wave resonator 900 described above, a detailed description of the frequency adjusting layer 1060 will be omitted and will be replaced with the description above.

The conductive layer 1070 is formed on a portion of a region of an edge of the lower electrode 1030 and a portion of a region of an edge of the upper electrode 1050. In other words, the conductive layer 1070 is formed on portions of the lower electrode 1030 and the upper electrode 1050 that are disposed outside the active area S.

The conductive layer 1070 is formed of a material having good conductivity, and thus reflection leakage due to the conductive layer 1070 may be reduced and electrical resistance may be lowered. As an example, the conductive layer 1070 is formed of a material such as gold (Au), aluminum (Al), or copper (Cu), a bonding assist layer (not shown) for bonding the conductive layer 1070 may be formed below the conductive layer 1070, and the bonding assist layer may be formed of a material such as titanium (Ti) or chromium (Cr).

Figure 12:
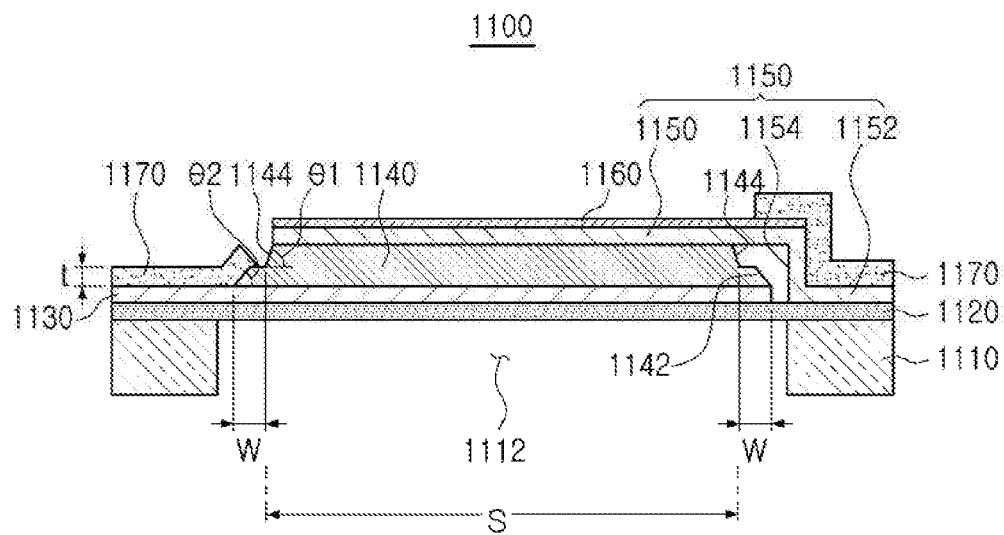
FIG. 12 is a schematic configuration view illustrating a bulk acoustic wave resonator, according to another embodiment.

FIG. 12 is a schematic configuration view illustrating a bulk acoustic wave resonator 1100, according to another embodiment.

Referring to FIG. 12, the bulk acoustic wave resonator 1100 includes a substrate 1110, a membrane layer 1120, a lower electrode 1130, a piezoelectric layer 1140, an upper electrode 1150, a frequency adjusting layer 1160, and a conductive layer 1170.

Since the substrate 1110, the membrane 1120, the lower electrode 1130, and the upper electrode 1150 are substantially the same as the substrate 110, the membrane layer 120, the lower electrode 130, and the upper electrode 150, which are included in the bulk acoustic wave resonator 100 described above, a detailed description of the substrate 1110, the membrane 1120, the lower electrode 1130, and the upper electrode 1150 will be omitted herein and will be replaced with the description provided above.

In addition, since the piezoelectric layer 1140, which includes a step portion 1142, a first inclined surface 1144, and a second inclined surface 1146, is the same component as the piezoelectric layer 440 included in the bulk acoustic wave resonator 400 described above, a detailed description of the piezoelectric layer 1140 will be omitted and will be replaced with the description above.

In addition, since the frequency adjusting layer 1160 is the same component as the frequency adjusting layer 960 included in the bulk acoustic wave resonator 900 described above, a detailed description of the frequency adjusting layer 1160 will be omitted and will be replaced with the description above.

The conductive layer 1170 is formed on a portion of a region of an edge of the lower electrode so as to cover a portion of the piezoelectric layer 1140, and is also formed on a portion of a region of an edge of the upper electrode 1150. In other words, the conductive layer 1170 is formed on the lower electrode 1130 and the upper electrode 1150 so as to cover a portion of an edge of the active area S.

Since the conductive layer 1170 is formed of a material having good conductivity, reflection leakage due to the conductive layer 1170 may be reduced and electrical resistance may be lowered. As an example, the conductive layer 1170 is formed of a material such as gold (Au), aluminum (Al), or copper (Cu), a bonding assist layer (not shown) for bonding the conductive layer 1170 is formed below the conductive layer 1170, and the bonding assist layer may be formed of a material such as titanium (Ti) or chromium (Cr).

Since the region on which the conductive layer 1170 is formed is the region in which a change in acoustic wave characteristics is not large, a distance between the upper electrode 1150 and the lower electrode 1130, and the conductive layer 1170 may be reduced, thereby lowering the electrical resistance.

Figure 13:
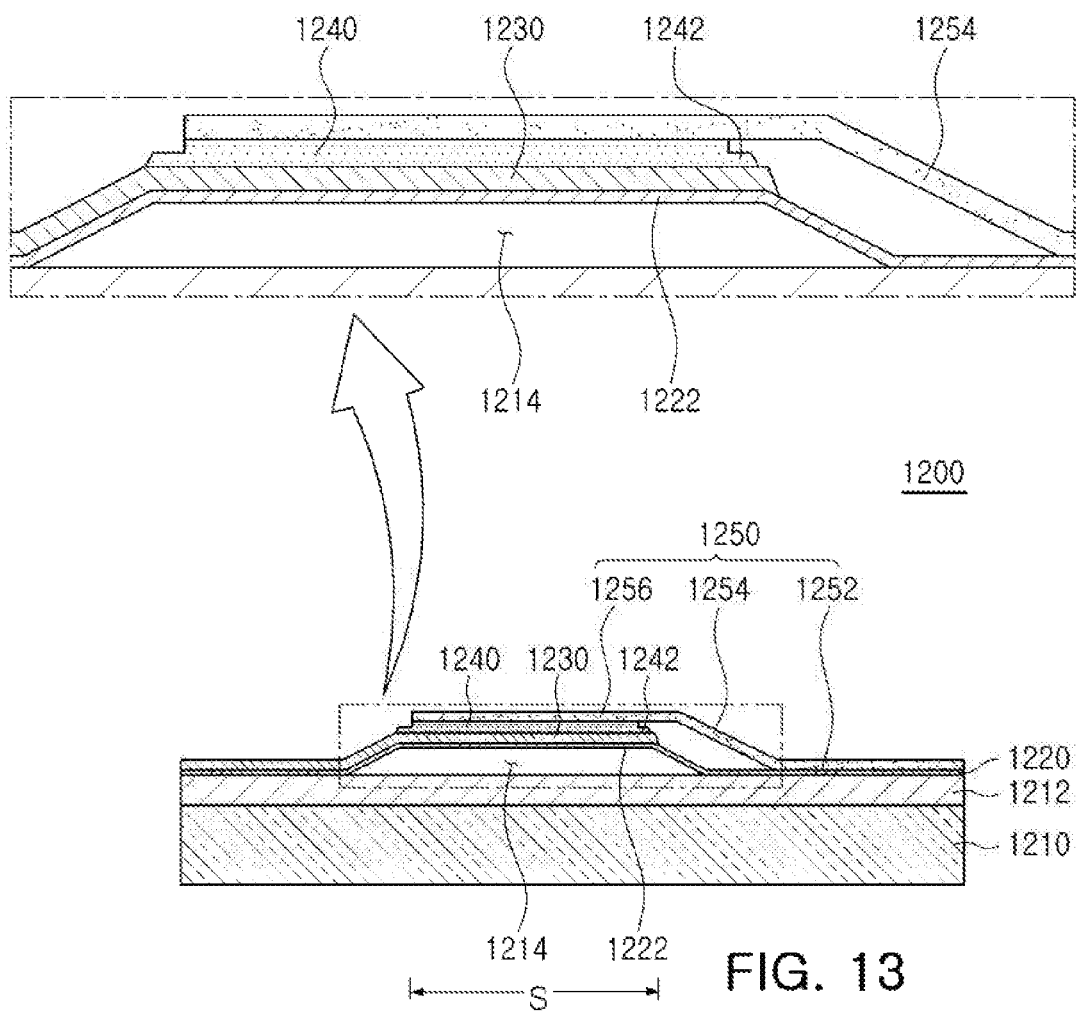
FIG. 13 is a schematic configuration view illustrating a bulk acoustic wave resonator, according to another embodiment.

FIG. 13 is a schematic configuration view illustrating a bulk acoustic wave resonator 1200, according to another embodiment.

Referring to FIG. 13, the bulk acoustic wave resonator 1200 includes, for example, a substrate 1210, a membrane layer 1220, a lower electrode 1230, a piezoelectric layer 1240, and an upper electrode 1250.

The substrate 1210 may be a substrate on which silicon is stacked. For example, a silicon wafer is used as the substrate. A substrate protective layer 1212 is formed on the substrate 1210.

In addition, the substrate 1210 forms a cavity 1214 together with the membrane layer 1220.

The membrane layer 1220 is formed on a top surface of the substrate 1210 and forms the cavity 1214 together with the substrate 1210. The membrane layer 1220 prevents the lower electrode 1230 from being damaged by etching gas when a sacrificial layer (not shown) is removed during the manufacturing of the bulk acoustic wave resonator 1200. As an example, the membrane layer 1220 is formed of a material having low reactivity with halide-based etching gas. For example, the membrane layer 1220 is formed of a material such as silicon nitride (SiN) or silicon oxide ($SiO_2$).

A convex portion 1222 of the membrane layer 1220 for forming the cavity 1214 together with the substrate 1210 is formed approximately in a central portion of the membrane layer 1220. In addition, an inclined surface is formed at edges of the convex portion 1222, and a flat surface is formed in a central portion of the convex portion 1222.

The lower electrode 1230 is disposed on the membrane layer 1220, and a portion of the lower electrode 1230 covers the flat surface of the convex portion 1222. As an example, the lower electrode 1230 is formed of a conductive material such as molybdenum (Mo), ruthenium (Ru), tungsten (W), iridium (Ir), or platinum (Pt), or alloys thereof.

In addition, the lower electrode 1230 may be used as either one of an input electrode that inputs an electrical signal such as a radio frequency (RF) signal, and an output electrode.

The piezoelectric layer 1240 is disposed on the flat surface of the lower electrode 1230. In addition, the piezoelectric layer 1240 includes a step portion 1242 extended from a side thereof, at a lower portion of the side, and disposed on the flat surface of the lower electrode 1230. In other words, the bulk acoustic wave resonator 1200 includes the piezoelectric layer 1240 including the side in a shape of a multistage edge, without forming a separate frame on the upper electrode 1250.

Accordingly, a lateral wave propagating from an upper end portion of the piezoelectric layer 1240 may encounter the air at a side of the upper end portion of the piezoelectric layer 1240, thereby increasing a reflection coefficient. In addition, the lateral wave propagating from a lower end portion of the piezoelectric layer 1240 may additionally reflect a leakage wave by the step portion 1242 protruding from the lower end portion of the piezoelectric layer 1240, thereby decreasing lateral wave leakage. In other words, the leakage wave may be additionally reflected by a width of the step portion 1242 protruding from the lower end portion of the piezoelectric layer 1240, thereby decreasing lateral wave leakage.

During resonance driving of the bulk acoustic wave resonator 1200, a lateral wave having a plurality of modes may occur, and the lateral wave may propagate in a lateral direction in a form of various modes (S1, A1, S0, A0 modes, etc.) at an antiresonance frequency, causing loss of energy. Accordingly, the bulk acoustic wave resonator 1200 may sequentially reflect these modes by using the multistage edge. That is, in a case in which the lateral wave occurring from the active area S arrives at the side of the upper end portion of the piezoelectric layer 1240, the modes (S1, A1, etc.) having a relatively long wavelength may reflect the lateral wave, and the modes (S0, A0, etc.) having a relatively short wavelength may reflect the lateral wave by using two boundary surfaces formed by the protruded step portion 1242 of the piezoelectric layer 1240, thereby improving reflection efficiency.

In this case, when the width w of the step portion 1242 of the piezoelectric layer 1240 is designed based on a wavelength A as in Equation 1 provided above, the reflection efficiency may be significantly increased, thereby making it possible to increase quality factor (Q performance.

Further, when a thickness t of the step portion 1242 is less than half of an overall thickness of the piezoelectric layer 1240, an effect on reflection of lateral waves may be larger, and when the thickness t of the step portion 1242 is varied, a value of an optimal width w may be changed.

The upper electrode 1250 covers at least a portion of the piezoelectric layer 1240, and is formed to expose the side of the piezoelectric layer 1240 to the air. The upper electrode 1250 has a step shape. As an example, the upper electrode 1250 includes a support member 1252 formed on the membrane layer 1220 to be spaced apart from the lower electrode 1230, an extending part 1254 extended from the support member 1252 and spaced apart from the piezoelectric layer 1240, and a connecting part 1256 extended from the extending part 1254 and covering a top surface of the piezoelectric layer 1240.

The extending part 1254 may have a gradient corresponding to (e.g., substantially the same as) a gradient of the inclined surface formed at the edges of the convex portion 1222.

In addition, the upper electrode 1250 is formed of a conductive material such as molybdenum (Mo), ruthenium (Ru), tungsten (W), iridium (Ir), or platinum (Pt), or alloys thereof, similarly to the lower electrode 1230.

The lower electrode 1250 may be used as either one of an input electrode that inputs an electrical signal such as a radio frequency (RF) signal, and an output electrode. That is, in a case in which the lower electrode 1230 is used as the input electrode, the upper electrode 1250 is used as the output electrode, and in a case in which the lower electrode 1230 is used as the output electrode, the upper electrode 1250 is used as the input electrode.

As described above, reflection leakage of a lateral wave may be reduced.

Hereinafter, a method for manufacturing the bulk acoustic wave resonator 1200, according to an embodiment, will be described with reference to the drawings.

FIGS. 14 through 21 are process views illustrating a method for manufacturing the bulk acoustic wave resonator 1200.

Figure 14:
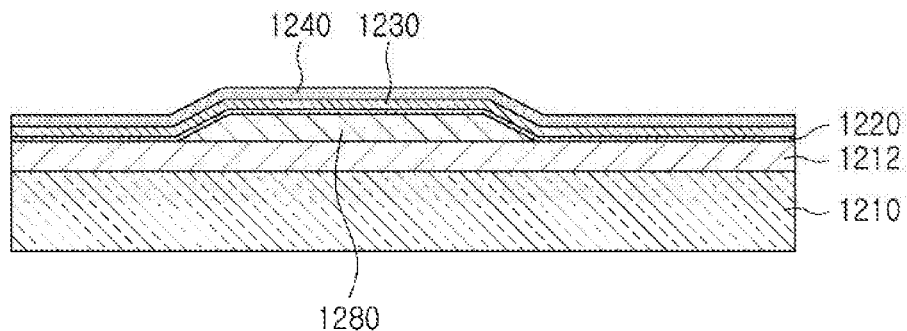
FIGS. 14 through 21 are process views illustrating a method for manufacturing the bulk acoustic wave resonator of FIG. 13, according to an embodiment.

First, referring to FIG. 14, a first sacrificial layer 1280, the membrane layer 1220, the upper electrode 1230, and the piezoelectric layer 1240 are sequentially formed on the substrate 1210 on which the substrate protective layer 1212 is formed.

As an example, the first sacrificial layer 1280 has a cross-section of trapezoidal shape.

Figure 15:
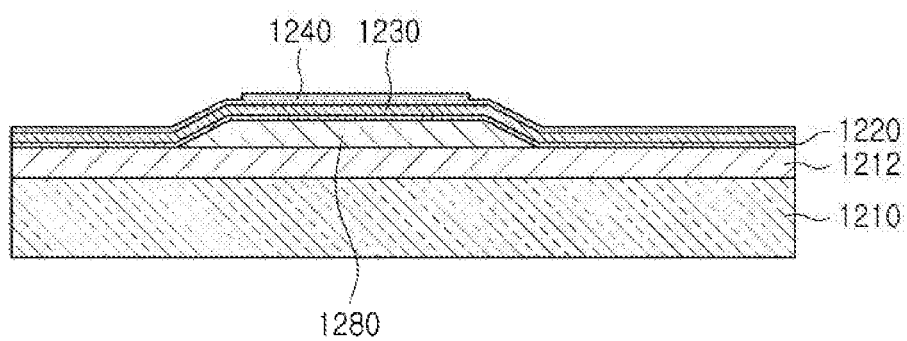

Next, as illustrated in FIG. 15, an etching is performed to reduce a thickness of the remaining region except for the piezoelectric layer 1240 disposed on the first sacrificial layer 1280. In this case, in order to etch the piezoelectric layer 1240, a dry etching may be used.

Figure 16:
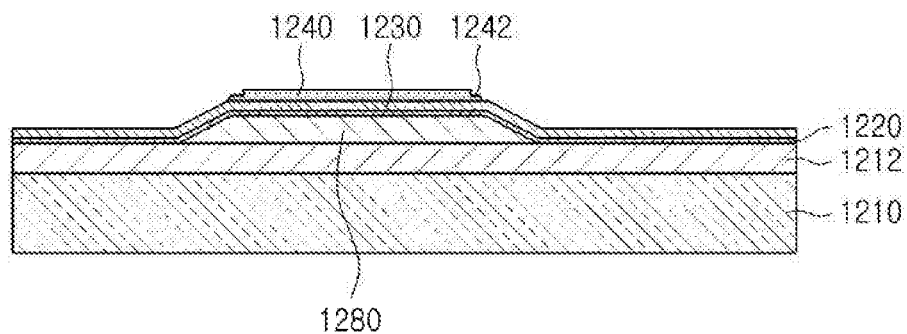

Next, as illustrated in FIG. 16, the piezoelectric layer 1240 is etched so that the step portion 1242 is formed at a lower end portion of the piezoelectric layer 1240. An angle of an inclined surface formed by the etching may be changed according to a mask layer (not shown).

Figure 17:
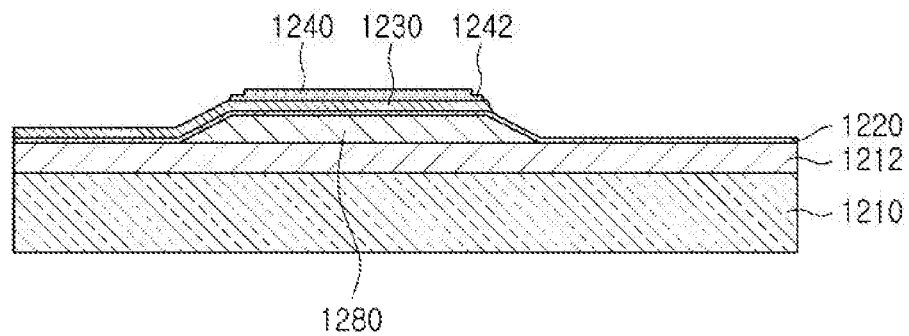

Next, as illustrated in FIG. 17, a portion of the lower electrode 1230 is removed.

Figure 18:
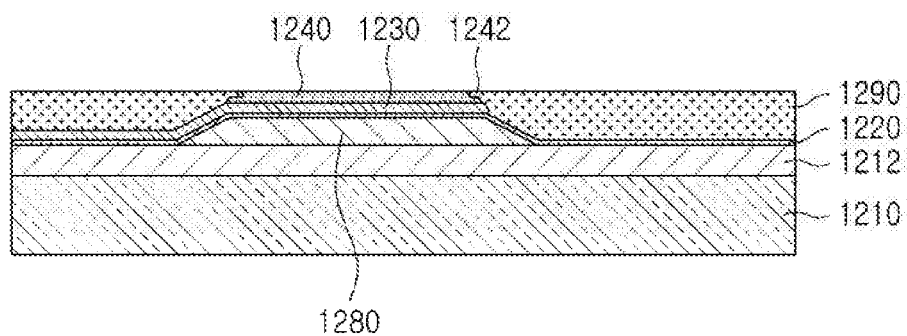

Next, as illustrated in FIG. 18, the membrane layer 1220 is formed so that a top surface of the piezoelectric layer 1240 is exposed, and a second sacrificial layer 1290 is formed to cover the lower electrode 1230. Next, a planarization operation is performed by using a chemical mechanical polishing operation.

Figure 19:
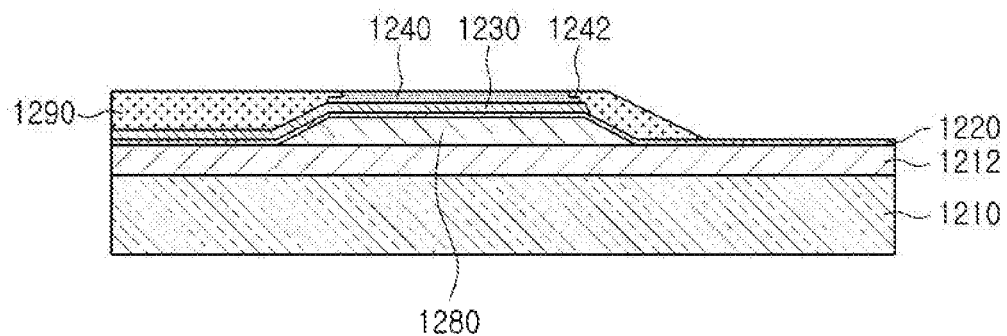

Next, as illustrated in FIG. 19, a portion of the second sacrificial layer 1290 is removed by a patterning operation. Further, one side of the second sacrificial layer 1290 may be inclined.

Figure 20:
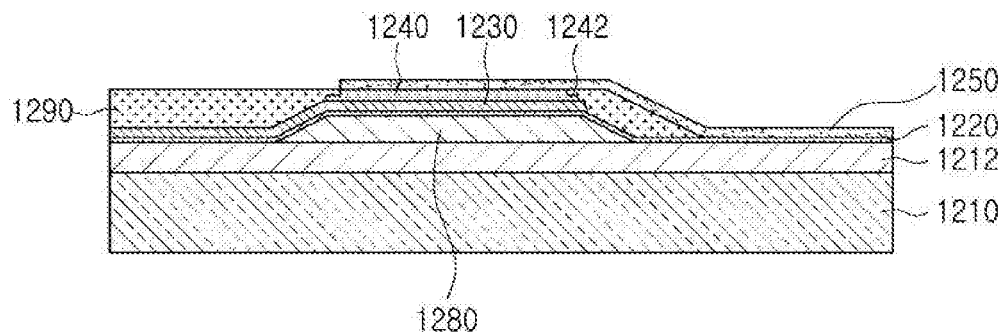

Next, as illustrated in FIG. 20, the upper electrode 1250 is formed to cover the piezoelectric layer 1240. The upper electrode 1250 covers one side of the second sacrificial layer 1290. In addition, an end of the upper electrode 1250 may coincide with an end of the piezoelectric layer 1240. In other words, the upper electrode 1250 may be formed so that the end of the upper electrode 1250 and the end of the piezoelectric layer 1240 coincide with each other, thereby forming a vertical boundary surface.

Figure 21:
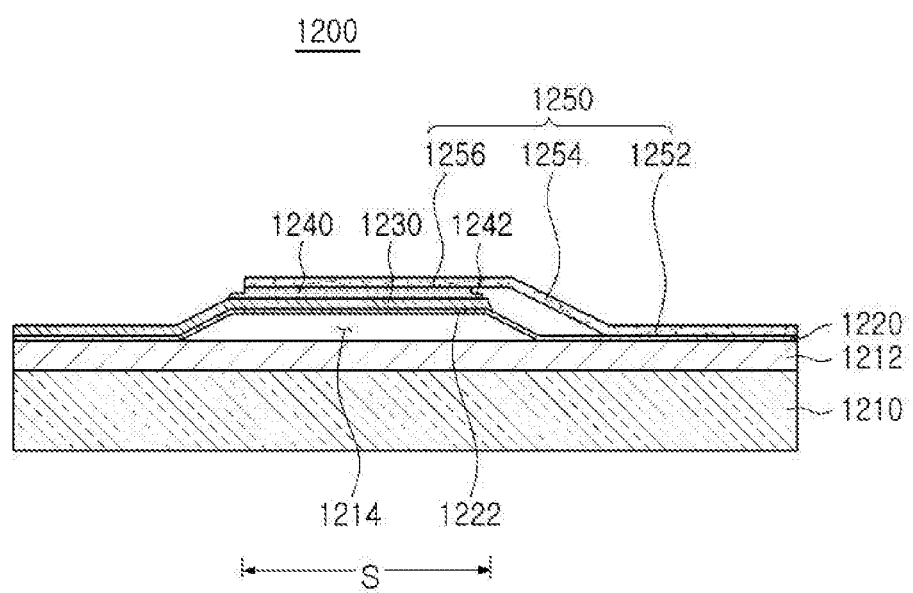

Next, as illustrated in FIG. 21, the first and second sacrificial layers 1280 and 1290 are removed to form the cavity 1214, and a predetermined space is formed by the membrane layer 1220 and the upper electrode 1250.

As set forth above, according to the embodiments disclosed herein, reflection leakage of a lateral wave may be reduced.

While this disclosure includes specific examples, it will be apparent after an understanding of the disclosure of this application that various changes in form and details may be made in these examples without departing from the spirit and scope of the claims and their equivalents. The examples described herein are to be considered in a descriptive sense only, and not for purposes of limitation. Descriptions of features or aspects in each example are to be considered as being applicable to similar features or aspects in other examples. Suitable results may be achieved if the described techniques are performed in a different order, and/or if components in a described system, architecture, device, or circuit are combined in a different manner, and/or replaced or supplemented by other components or their equivalents. Therefore, the scope of the disclosure is defined not by the detailed description, but by the claims and their equivalents, and all variations within the scope of the claims and their equivalents are to be construed as being included in the disclosure.

What is claimed is:

1. A bulk acoustic wave resonator, comprising:
a substrate;
a membrane layer forming a cavity together with the substrate;
a lower electrode disposed on the membrane layer;
a piezoelectric layer disposed on a flat surface of the lower electrode; and
an upper electrode covering a portion of the piezoelectric layer and a remaining uncovered portion of the piezoelectric layer exposed to air,
wherein the the remaining uncovered portion of the piezoelectric layer forms a step portion on the flat surface of the lower electrode.

2. The bulk acoustic wave resonator of claim 1, wherein a thickness of the step portion is less than half of an overall thickness of the piezoelectric layer.

3. The bulk acoustic wave resonator of claim 1, wherein
a width w by which the step portion protrudes from the remaining uncovered portion of the piezoelectric layer satisfies w=n×λ/4(n=1, 3, 5, . . . ), and
λ is a wavelength of a lateral wave occurring in an active area of the bulk acoustic wave resonator.

4. The bulk acoustic wave resonator of claim 1, wherein a first inclined surface is formed on the remaining uncovered portion of the piezoelectric layer, and is disposed on the step portion.

5. The bulk acoustic wave resonator of claim 4, wherein the first inclined surface comprises an angle of inclination of 60° to 90° with respect to the membrane layer.

6. The bulk acoustic wave resonator of claim 4, wherein a second inclined surface is formed on a side of the step portion.

7. The bulk acoustic wave resonator of claim 1, wherein an edge portion of the lower electrode protrudes from the step portion of the piezoelectric layer or is disposed inwardly from the step portion.

8. The bulk acoustic wave resonator of claim 1, further comprising a residual sacrificial layer disposed in a space formed by the membrane layer, the piezoelectric layer, and the upper electrode.

9. The bulk acoustic wave resonator of claim 8, wherein the residual sacrificial layer is formed to embed the step portion of the piezoelectric layer.

10. The bulk acoustic wave resonator of claim 1, further comprising a frequency adjusting layer disposed on the upper electrode.

11. The bulk acoustic wave resonator of claim 1, further comprising a conductive layer partially formed on either one or both of a region of an edge of a top surface of the lower electrode and a region of an edge of a top surface of the upper electrode.

12. The bulk acoustic wave resonator of claim 11, wherein the conductive layer covers a portion of the piezoelectric layer.

13. The bulk acoustic wave resonator of claim 12, wherein a frequency adjusting layer is disposed on the top surface of the upper electrode, over the cavity, and
the conductive layer covers a portion of an edge of the frequency adjusting layer.

14. The bulk acoustic wave resonator of claim 1, wherein the upper electrode comprises
a support member disposed on the membrane layer so as to be spaced apart from the lower electrode,
an extending part extended from the support member and spaced apart from the piezoelectric layer, and
a connecting part extended from the extending part and covering a top surface of the piezoelectric layer.

15. A bulk acoustic wave resonator, comprising:
a substrate;
a membrane layer comprising a convex part forming a cavity together with the substrate;
a lower electrode disposed on the membrane layer;
a piezoelectric layer disposed on a flat surface of the lower electrode;
an upper electrode comprising a support member disposed on the membrane layer so as to be spaced apart from the lower electrode, an extending part extended from the support member and spaced apart from the piezoelectric layer, and a connecting part extended from the extending part and disposed on a top surface of the piezoelectric layer,
wherein the piezoelectric layer comprises a step portion extended from an uncovered side of the piezoelectric layer and disposed on the flat surface of the lower electrode.

16. The bulk acoustic wave resonator of claim 15, wherein the extending part is inclined, and
an edge of the convex part of the membrane layer is inclined to have a gradient corresponding to a gradient of the extending part.

17. The bulk acoustic wave resonator of claim 15, wherein
a thickness of the step portion is less than half of an overall thickness of the piezoelectric layer,
a width w by which the step portion protrudes from the side of the piezoelectric layer satisfies $w = n \times \lambda/4 (n=1, 3, 5, \ldots)$, and
$\lambda$ is a wavelength of a lateral wave occurring in an active area of the bulk acoustic wave resonator.

18. The bulk acoustic wave resonator of claim 15, wherein the support member, the extending part, and the connecting part form a step shape.

19. A bulk acoustic wave resonator, comprising:
a substrate;
a membrane layer forming a cavity together with the substrate;
a lower electrode disposed on the membrane layer;
a piezoelectric layer disposed on a flat surface of the lower electrode; and
an upper electrode covering a portion of the piezoelectric layer and with an uncovered side of the piezoelectric layer exposed to air,
wherein the piezoelectric layer comprises a step portion extended from the uncovered side of the piezoelectric layer and disposed on the flat surface of the lower electrode,
a width w by which the step portion protrudes from the side of the piezoelectric layer satisfies $w = n \times \lambda/4 (n=1, 3, 5, \ldots)$, and
$\lambda$ is a wavelength of a lateral wave occurring in an active area of the bulk acoustic wave resonator.

20. The bulk acoustic wave resonator of claim 19, wherein a first inclined surface is formed on the uncovered side of the piezoelectric layer, and is disposed on the step portion.

* * * * *